United States Patent
Howell

(10) Patent No.: US 7,914,296 B1
(45) Date of Patent: Mar. 29, 2011

(54) INTERCONNECTING ASSEMBLY WITH CONDUCTIVE LEVER PORTIONS ON A SUPPORT FILM

(75) Inventor: Robert P. Howell, San Jose, CA (US)

(73) Assignee: Exatron, Inc., San Jose, CA (US)

(*) Notice: Subject to any disclaimer, the term of this patent is extended or adjusted under 35 U.S.C. 154(b) by 0 days.

(21) Appl. No.: 12/652,685

(22) Filed: Jan. 5, 2010

(51) Int. Cl.
*H01R 12/00* (2006.01)

(52) U.S. Cl. .......................................................... 439/67

(58) Field of Classification Search .................... 439/67, 439/66, 65, 74
See application file for complete search history.

(56) References Cited

U.S. PATENT DOCUMENTS

| | | | | |
|---|---|---|---|---|
| 3,511,201 A * | 5/1970 | Howell | | 112/240 |
| 3,854,432 A * | 12/1974 | Howell | | 112/235 |
| 3,859,939 A * | 1/1975 | Howell | | 112/235 |
| 4,548,451 A * | 10/1985 | Benarr et al. | | 439/85 |
| 5,044,980 A * | 9/1991 | Krumme et al. | | 439/496 |
| 5,069,628 A * | 12/1991 | Crumly | | 439/67 |
| 5,430,614 A * | 7/1995 | Difrancesco | | 361/785 |
| 5,506,514 A * | 4/1996 | Difrancesco | | 324/757 |
| 5,642,055 A * | 6/1997 | Difrancesco | | 324/757 |
| 5,759,047 A * | 6/1998 | Brodsky et al. | | 439/66 |
| 5,811,982 A * | 9/1998 | Beaman et al. | | 324/762 |
| 6,142,789 A * | 11/2000 | Nolan et al. | | 439/66 |
| 6,208,025 B1 * | 3/2001 | Bellaar et al. | | 257/696 |
| 6,247,228 B1 * | 6/2001 | Distefano et al. | | 29/830 |
| 6,420,661 B1 * | 7/2002 | Di Stefano et al. | | 174/260 |
| 6,570,101 B2 * | 5/2003 | Stefano et al. | | 174/261 |
| 6,648,367 B2 * | 11/2003 | Breed et al. | | 280/730.1 |
| 6,700,072 B2 * | 3/2004 | Distefano et al. | | 174/256 |
| 6,703,851 B1 * | 3/2004 | Howell | | 324/754 |
| 7,090,503 B2 * | 8/2006 | Dittmann | | 439/66 |
| 7,166,914 B2 * | 1/2007 | DiStefano et al. | | 257/713 |
| 7,307,845 B2 * | 12/2007 | Mayer | | 361/719 |
| 7,354,276 B2 * | 4/2008 | Dittmann | | 439/66 |
| 7,645,147 B2 * | 1/2010 | Dittmann | | 439/82 |
| 2010/0009554 A1 * | 1/2010 | Ryu et al. | | 439/65 |

* cited by examiner

*Primary Examiner* — T C Patel
*Assistant Examiner* — Vladimir Imas
(74) *Attorney, Agent, or Firm* — Stephen M. De Klerk; SNR Denton US LLP

(57) ABSTRACT

The invention provides an interconnecting assembly including a main structure having first and second portions, an inner terminal on the main structure, a support film having first and second portions, an inner contact and outer terminal formed on opposing sides of the support film, a conductive lever portion on the support film and connecting the inner contact and outer terminal, wherein the inner contact contacts the inner terminal and the first portions are moved relatively towards one another so that the second portion of the film is pivoted together with the conductive lever portion and the outer terminal away from the second portion of the main structure, the outer terminal being depressible towards the main structure from a first position to a second position and returning to the first position when a force depressing the outer terminal is removed.

11 Claims, 6 Drawing Sheets

INTERCONNECTING ASSEMBLY WITH CONDUCTIVE LEVER PORTIONS ON A SUPPORT FILM

BACKGROUND OF THE INVENTION

1). Field of the Invention

This invention relates generally to an interconnecting assembly and more specifically to an interposer.

2). Discussion of Related Art

Integrated circuits are formed on semiconductor wafers. The wafers are then sawed (or "singulated" or "diced") to microelectronic dies, also known as semiconductor chips, with each chip carrying a respective integrated circuit. Each semiconductor chip is then mounted to a package, or carrier substrate, thereby forming an electronic package or a semiconductor package. The packages are temporarily connected to test sockets so that the integrated circuit can be tested before it is sold. The package is then mounted to a printed circuit board, which may then be installed into a computing system.

Interposers are often used during testing to ensure the electrical connection between the test socket and the package, as well as between the printed circuit board and the package. Such an interposer typically has a substrate with via holes therethrough and vias within the via holes to electrically connect the package to either the test socket or the printed circuit board. Springs can then be connected to the vias and the springs ensure uniform contact when they are depressed by contacts on the package or a printed circuit board.

If more range is required in a direction that the spring is compressed, then pogo pins are often used. The pogo pin is held between two halves of a substrate. Opposing ends of the pogo pin protrude through openings in the two halves. Such an interposer can be expensive because pogo pins themselves are expensive and the assembly methods that may be required are labor intensive.

SUMMARY OF THE INVENTION

The invention provides an interconnecting assembly including a main structure having first and second portions, an inner terminal on the main structure, a support film having first and second portions, an inner contact and outer terminal formed on opposing sides of the support film, a conductive lever portion on the support film and connecting the inner contact and outer terminal, wherein the inner contact contacts the inner terminal and the first portions are moved relatively towards one another so that the second portion of the film is pivoted together with the conductive lever portion and the outer terminal away from the second portion of the main structure, the outer terminal being depressible towards the main structure from a first position to a second position and returning to the first position when a force depressing the outer terminal is removed.

The interconnecting assembly may further include an adhesive between the first portions to attach the first portion to one another.

The interconnecting assembly may further include a metal support on the support film, the adhesive attaching both the metal support and the first portion of the support film to the main structure, the first portion of the support film being depressed in an area between the metal support and the inner terminal.

The interconnecting assembly may include that the inner contact and the inner terminal form an interference fit.

The interconnecting assembly may further include an outer via connecting the conductive lever portion to the outer terminal.

The interconnecting assembly may further include a plurality of inner contacts and outer terminals formed on the opposing sides of the support film, and a plurality of lever portions on the support film and connecting a respective one of the inner contacts on a respective one of the outer contacts.

The interconnecting assembly may further include a plurality of inner terminals, wherein each inner contact contacts a respective inner terminal and the first and second portions are moved relatively towards one another so that the second portion of the film is pivoted together with the conductive portions and the outer terminals away from the second portions of the main structure.

The invention also provides a method of making an interconnect assembly, including positioning an inner contact on an inner terminal, moving a first portion of a support film on which the inner contact is formed relatively towards a first portion of a main structure on which the inner terminal is formed so that a second portion of a the film pivots together with an outer terminal and a conductive lever portion connecting the outer terminal to the inner contact away from a second portion of the main structure and attaching the first portions to one another.

The method may include that the first portions may be attached by an adhesive.

The method may further include simultaneously applying heat and pressure to the adhesive to soften the adhesive and allowing the adhesive to cool.

The method may include that the pressure may be applied with a shaping tool, further including securing the shaping tool t the main structure before allowing the adhesive to cool and removing the shaping tool from the main structure after the adhesive is allowed to cool.

BRIEF DESCRIPTION OF THE DRAWINGS

The invention is further described by way of example with reference to the accompanying drawings, wherein.

DETAILED DESCRIPTION OF THE INVENTION

Figure 1:
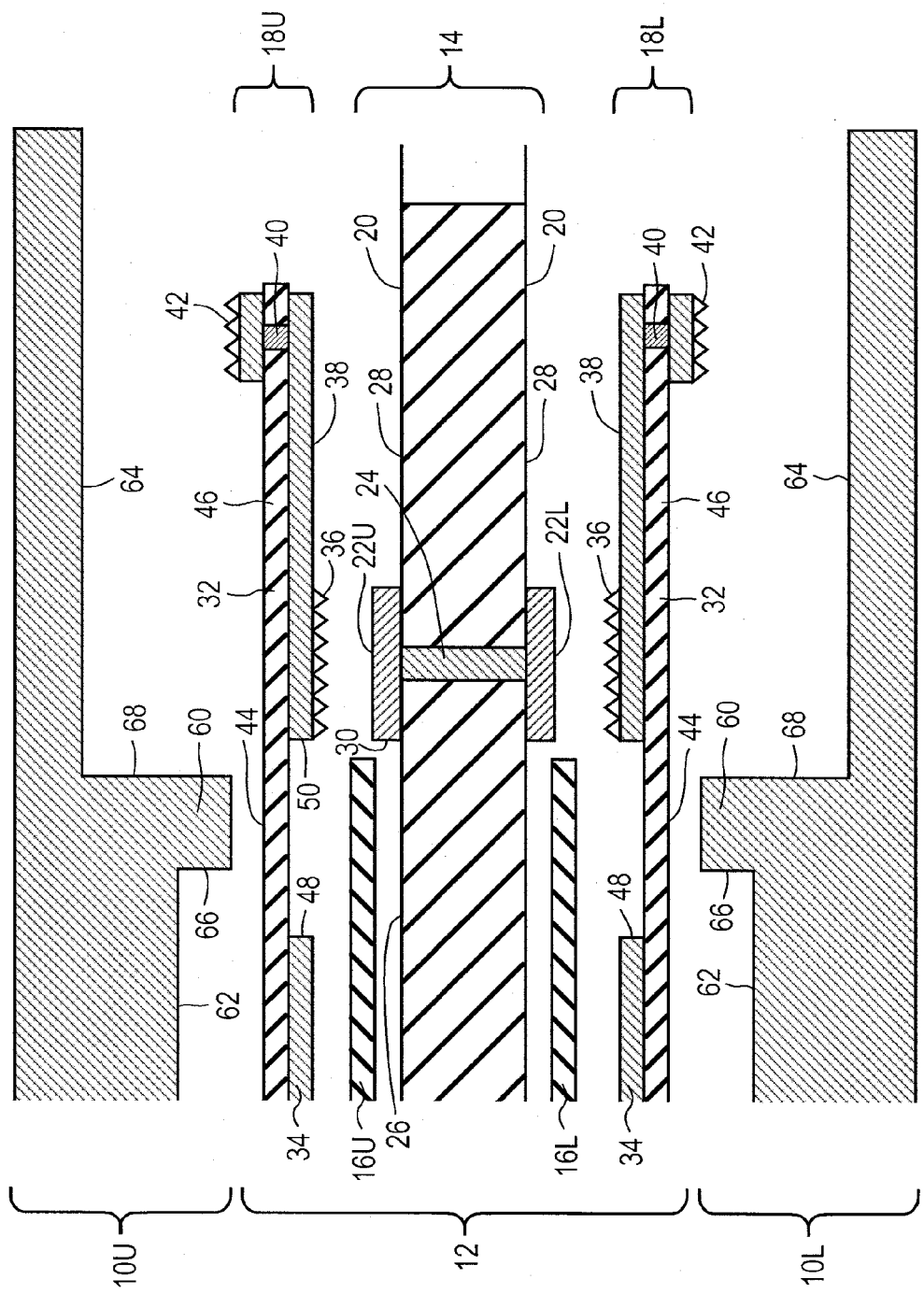
FIG. 1 is cross-sectional side view showing upper and lower shaping tools and components of an interconnecting assembly in the form of an interposer before the interposer is assembled.

FIG. 1 of the accompanying drawings illustrates upper and lower shaping tools 10U and 10L and an interconnecting assembly in the form of an interposer 12.

The interposer 12 includes a supporting substrate 14, an upper adhesive layer 16U, a lower adhesive layer 16L, an upper interconnect structure 18U and a lower interconnect structure 18L.

The supporting substrate 14 includes a main structure 20, upper and lower inner terminals 22U and 22L, and an inner via 24. The main structure 20 has an upper surface with first and second portions 26 and 28. The main structure 20 is made of an insulative material. The inner via 24 is in an opening of the main structure 20 extending from the upper surface of the main structure 20 to a lower surface of the main structure 20 in an area between the first portion 26 and the second portion 28. The upper inner terminal 22U is formed on the upper surface of the main structure 20. The upper inner terminal 22U is structurally connected to the inner via 24 and is larger than the inner via 24. The upper inner terminal 22U forms a step 30 above the first portion 26.

Similarly, the lower inner terminal 22L is formed on the lower surface of the main structure 20 and is structurally connected to the inner via 24.

The upper and lower inner terminals 22U and 22L and the inner via 24 are all made of a conductive metal. Electric current can thus conduct through the inner via 24 between the upper and lower inner terminals 22U and 22L.

The upper interconnect structure 18U has a support film 32, a metal support 34, an inner contact 36, a conductive lever portion 38, an outer via 40, and an outer terminal 42.

The support film 32 has first and second portions 44 and 46 and is made of a compliant, flexible, resilient, springable insulating material. The outer terminal 42 is formed on an upper surface of the second portion 46 of the support film 32. The outer via 40 is formed through and opening in the second portion 46 of the support film 32 and is structurally connected to the outer terminal 42. The conductive lever portion 38 and the inner contact 36 are formed on a lower surface of the second portion 46 of the support film 32. The outer via 40 is structurally connected to the conductive lever portion 38. The inner contact 36 and the outer terminal 42 have conductive particles formed thereon. The conductive particles may for example be metal-covered diamond particles.

The metal support 34 is formed on a lower surface of the support film 32. The metal support 34 and the inner contact 36 form steps 48 and 50, respectively, below a lower surface of the support film 32 in an area of the first portion 44.

The adhesive layer 16U is provided in the form of a sheet that does not have any adhesive qualities at room temperature. The upper adhesive layer 16U is positioned above the first portion 26 of the main structure 20. The upper interconnect structure 18U is positioned over the main structure 20 and the upper adhesive layer 16U such that the inner contact 36 is aligned with and above the inner terminal 22U. A recess formed between the steps 48 and 50 is located to the left of the upper inner terminal 22U and the second portion 46 of the support film 32 is positioned to the right of the upper inner terminal 22U.

The upper shaping tool 10U has a protrusion 60 that is positioned above the recess between the steps 48 and 50. The upper shaping tool 10U has recesses 62 and 64 to the left and the right of the protrusion 60. A step 66 formed by the recess 62 is larger than a step 68 formed by the recess 64.

The lower interconnect structure 18L, lower adhesive layer 16L and the lower shaping tool 10L are a mirror image of the upper interconnect structure 18U, upper adhesive layer 16U and the upper shaping tool 10U. Like reference numerals indicate like or similar components. Manufacturing of the interposer 12 will now further be described with reference to the upper interconnect structure 18U, upper adhesive layers 16U and the upper shaping tool 10U. It should be understood that the manufacturing of the interposer 12 with respect to the lower interconnect structure 18L, lower adhesive layer 16L and lower shaping tool 10L is similar.

Figure 2:
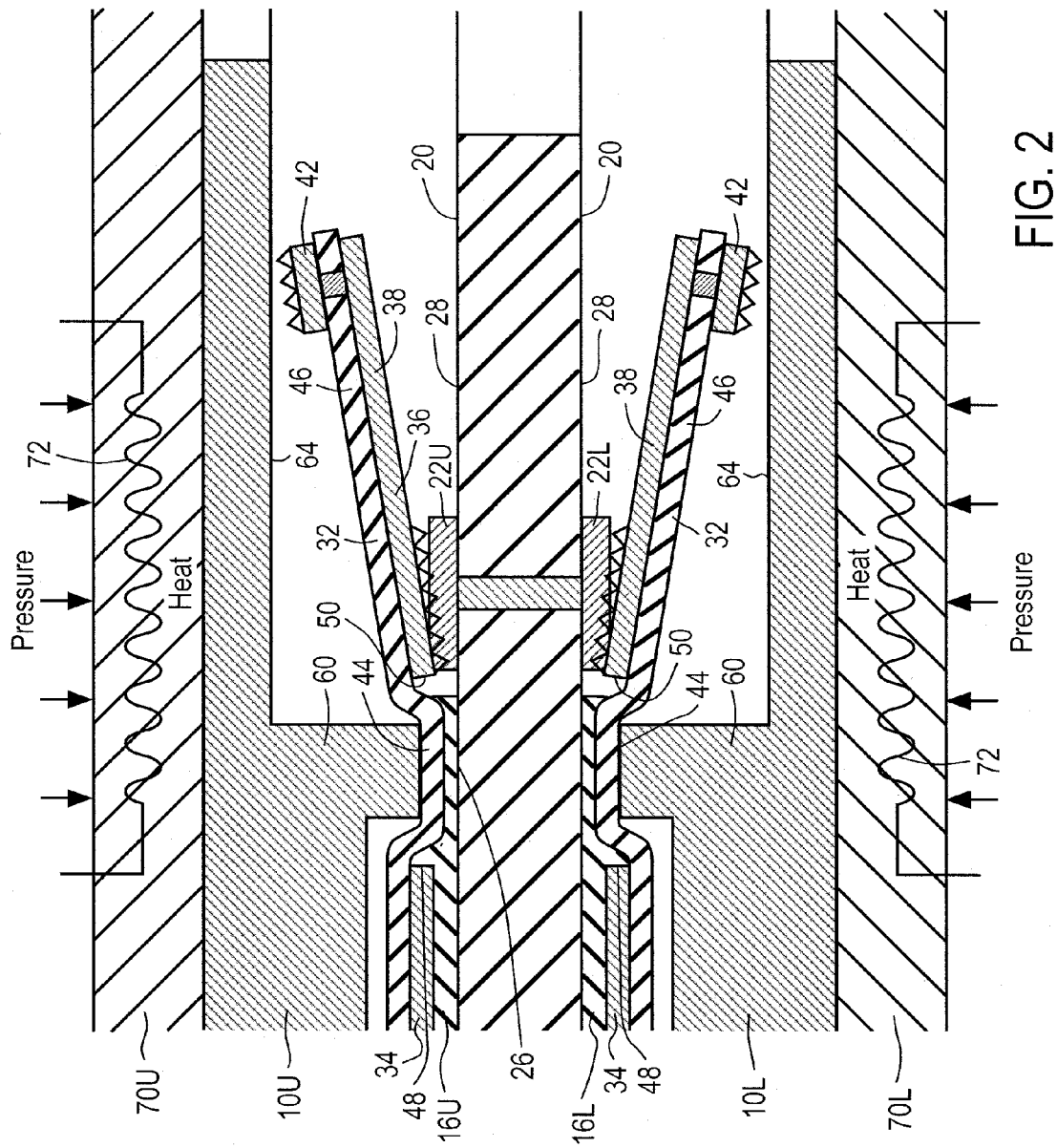
FIG. 2 is a view similar to FIG. 1 after heat and pressure are applied to the shaping tools.

Reference is now made to FIG. 2. An upper heat chuck 70U is located against an upper surface of the upper shaping tool 10U. A heater such as a heating element 72 within the upper heat chuck 70U is used to heat the upper shaping tool 10U. The upper heat chuck 70U is then used to apply pressure to the upper shaping tool 10U. A lower surface of the protrusion 60 makes contact with the first portion 44 of the support film 32. Heat conducts from the protrusion 60 through the first portion 44 to the upper adhesive layer 16U, causing the upper adhesive layer 16U to soften. The upper adhesive layer 16U then fills spaces between the metal support 34, the first portion 44 of the support film 32 and the first portion 26 of the main structure 20.

The softening of the upper adhesive layer 16U and the pressure provided by the protrusion 60 causes the protrusion 60 to depress the first portion 44 of the support film 32 into the recess between the steps 48 and 50. The inner contact 36 provides a pivot point on the upper inner terminal 22U so that the second portion 46 of the support film 32 pivots upwardly, counterclockwise away from the second portion 28 of the main structure 20. The pressure provided by the protrusion 60 also causes an interference fit between the inner contact 36 and the upper inner terminal 22U. The conductive lever portion 38 and the outer terminal 42 pivot together with the second portion 46 of the support film 32 away from the main structure 20. The recess 64 is deep enough so as not to restrict pivoting of the second portion 46 of the support film 32 away from the main structure 20.

Figure 3:
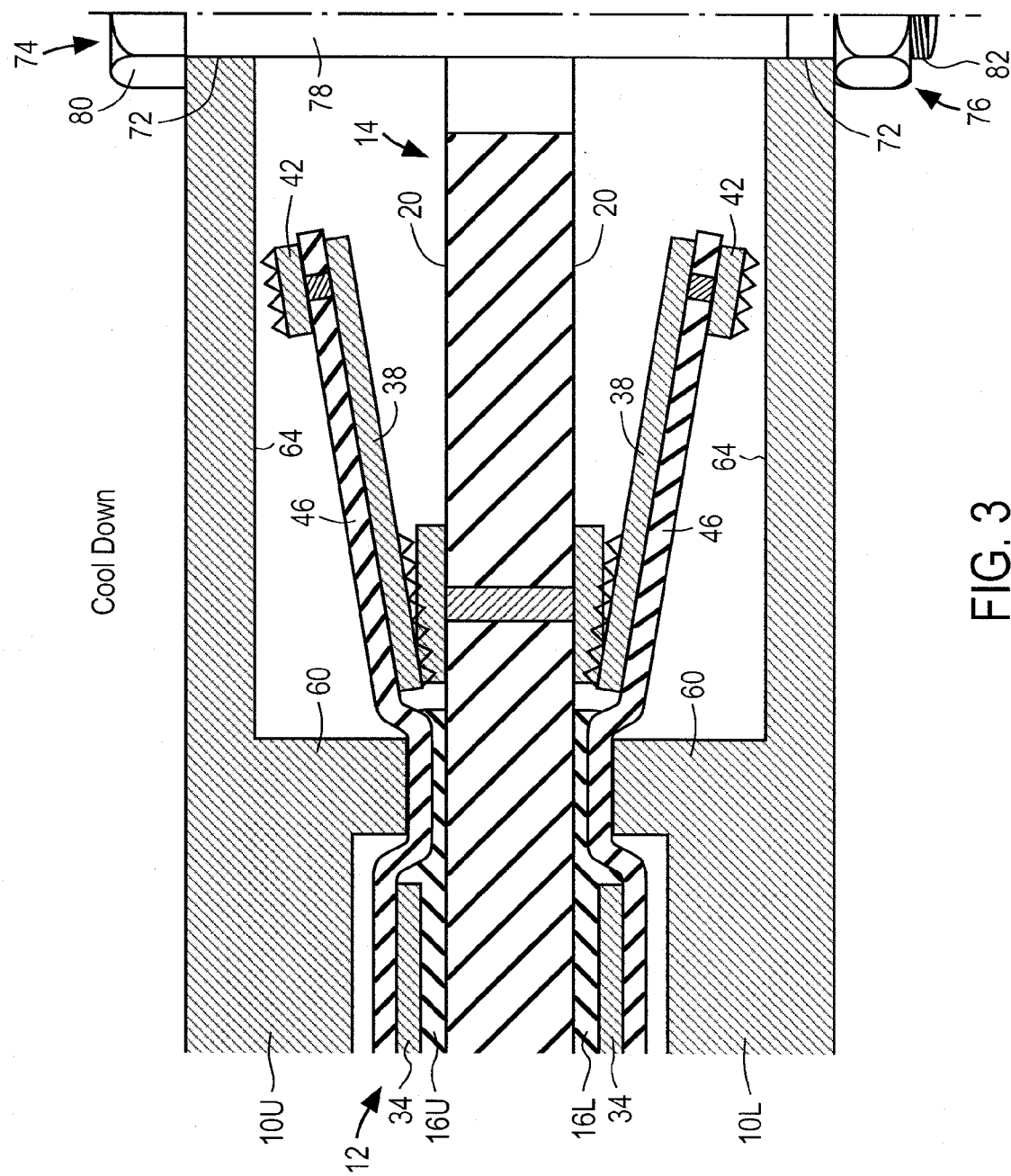
FIG. 3 is a view similar to FIG. 2 after a heat chuck is removed and the upper and lower shaping tools are secured to one another with a bolt and a nut.

Referring to FIG. 3, the upper and lower shaping tools 10U and 10L have aligned openings 72. A bolt 74 and a nut 76 are provided to secure the upper and lower shaping tools 10U and 10L to one another, and therefore to the supporting substrate 14. The bolt 74 has a shank 78 and a head 80. The shank 78 is inserted through the openings 72 and the head 80 rests on an upper surface of the upper shaping tool 10U. The nut 76 is screwed onto thread 82 on the shank 78 and rests against a lower surface of the lower shaping tool 10L. The entire assembly shown in FIG. 3 is then allowed to cool to room temperature. Although passive cooling is described wherein the assembly of FIG. 3 cools in air at room temperature, it is to be understood that active cooling such as with cold water is also within the scope of the invention and that the assembly can also be allowed to cool with active cooling.

Once the assembly has cooled, the upper and lower adhesive layers 16U and 16L have again solidified and have adhered to all adjacent components. The nut 76 is then removed from the bolt 74 and the bolt 74 is removed from the openings 72. The upper and lower shaping tools 10U and 10L are then removed from the interposer 12.

Figure 4:
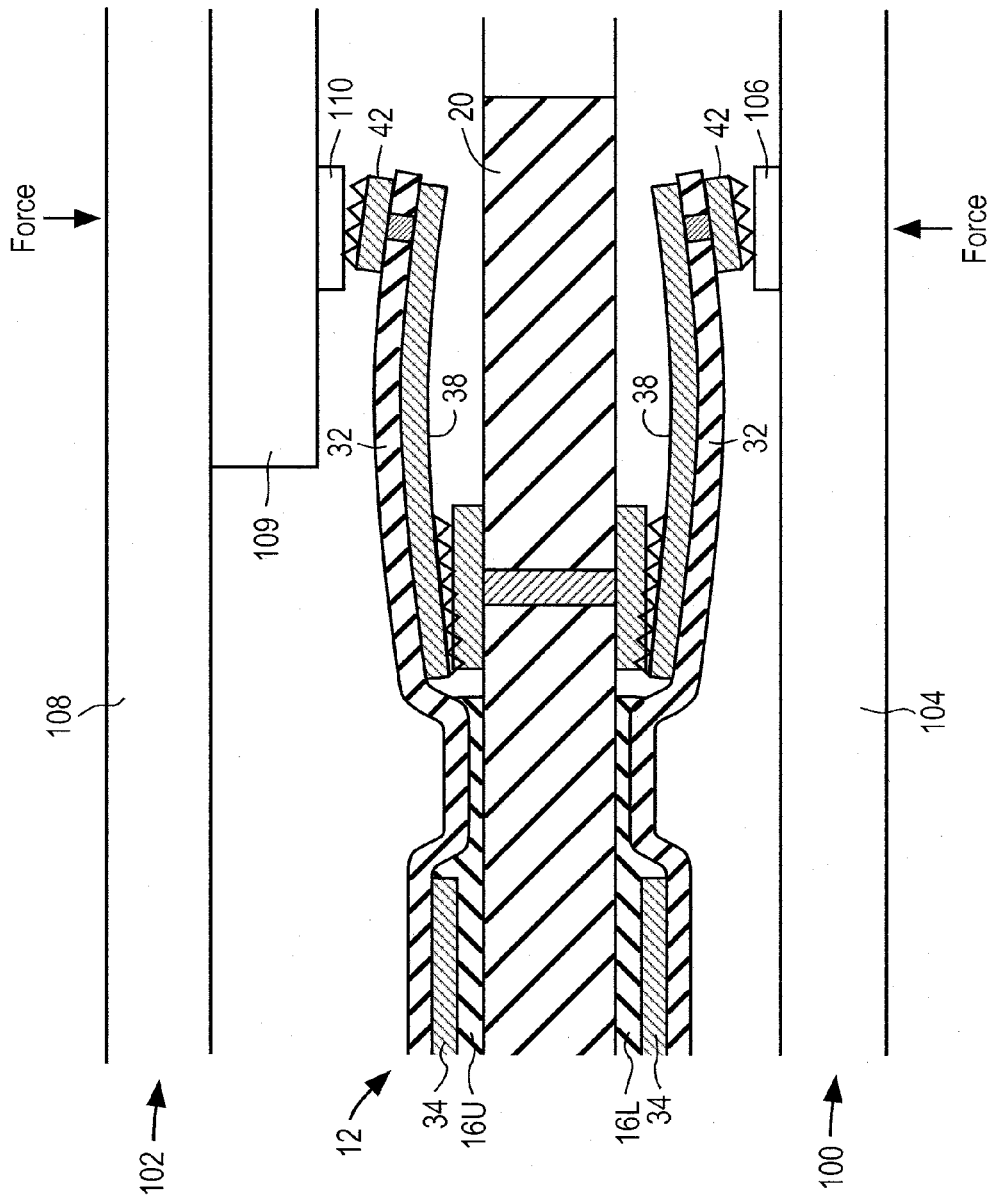
FIG. 4 is a view similar to FIG. 3 after the bolt, nut and upper and lower shaping tools are removed and the interposer is used to connect contacts of devices to one another.

FIG. 4 shows the use of the interposer 12 to provide an electric connection between a device such as a socket 100 and a device such as an electronics wireframe package 102. The socket 100 has a substrate 104 and a contact 106. The electronics wireframe package 102 has one or more substrates 108, a semiconductor chip 109 on the substrate 108 and a contact 110 on the semiconductor chip 109. The contacts 106 and 110 are aligned with the outer terminals 42. A force is then applied that moves the electronics wireframe package 102 towards the socket 100. The contacts 110 and 106 move the outer terminals 42 relatively towards one another. The material of the support films 32 and the conductive lever portions 38 are sufficiently flexible so that they bend to allow for movement of the outer terminals 42 towards the main structure 20, and to return to their original positions as shown in FIG. 3 when the force is removed. The amount of deflection provided by the support films 32 is equivalent to that of a pogo pin having a length similar to a distance between contacting surfaces of the outer terminals 42.

Figure 5:
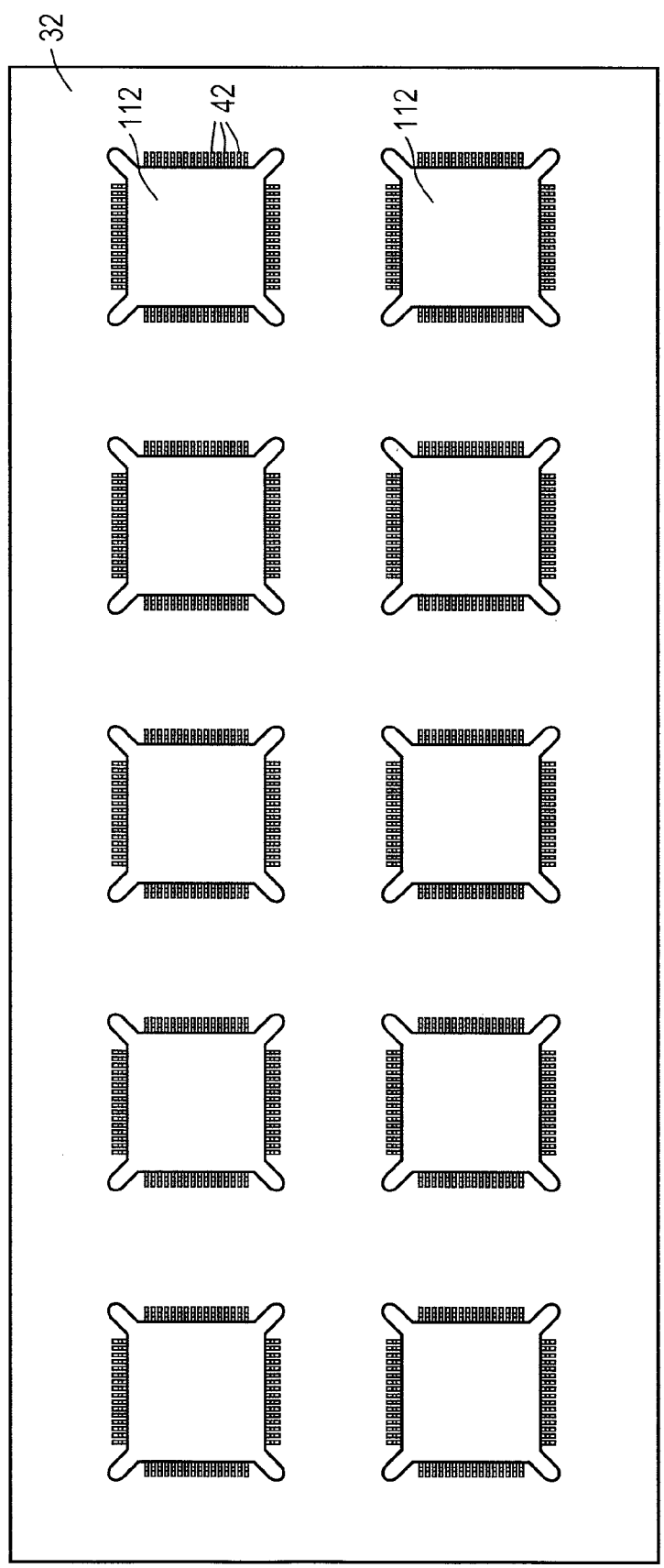
FIG. 5 is a top plan view of one support film showing multiple outer contacts.
Figure 6:
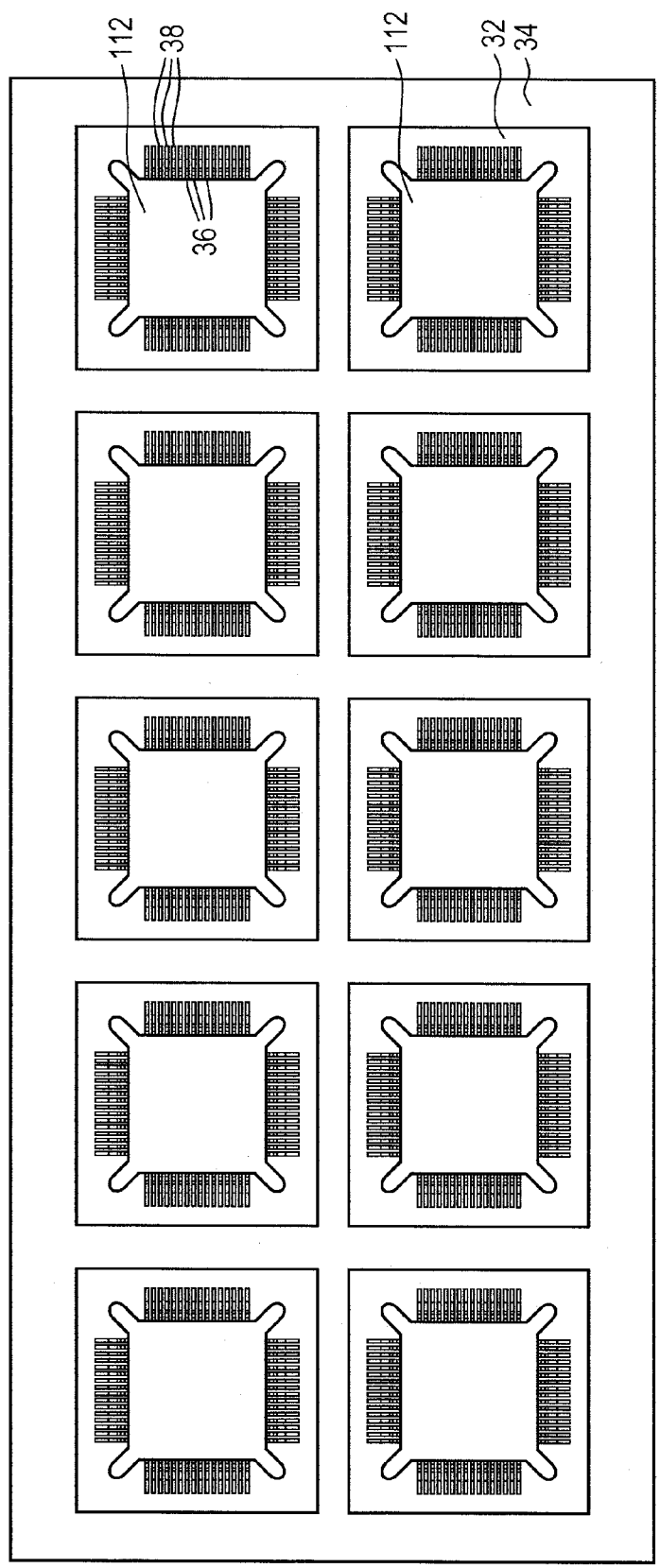
FIG. 6 is a bottom view of the support film of FIG. 5, showing multiple conductive lever portions and inner contacts.

FIG. 5 shows further details of one of the support films 32. The support film 32 has a plurality of cutouts 112 formed therein, each corresponding to a respective semiconductor chip. A plurality of outer terminals 42 are formed along a periphery of a respective cutout 112. Each cutout 112 has four main sides and a plurality of the outer terminals 42 are formed along a respective side of the cutout 112. As shown in FIG. 6, a plurality of conductive lever portions 38 are formed along a respective side of each cutout 112. It will be understood that each one of the outer terminals 42 make contact with a respective contact such as the contact 110 on a device. Similarly, inner terminal 36 is connected to a respective inner contact such as the upper inner terminal 22U shown in FIG. 2.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An interconnecting assembly comprising:
    a main structure having first and second portions;
    an inner terminal on the main structure;
    a compliant support film having first and second portions;
    an inner contact and outer terminal formed on opposing sides of the support film;
    a conductive lever portion on the support film and connecting the inner contact and outer terminal; and
    at least one step with the first portions on a first side of the step and the second portions on a second side of the step opposing the first side of the step, wherein the inner contact contacts, the inner terminal and the first portions are moved relatively towards one another so that the second portion of the film is pivoted together with the conductive lever portion and the outer terminal about the step away from the second portion of the main structure, the outer terminal being depressible towards the main structure from a first position to a second position and returning to the first position when a force depressing the outer terminal is removed.

2. The interconnecting assembly of claim 1, further comprising:
    an adhesive between the first portions to attach the first portion to one another.

3. The interconnecting assembly of claim 1, further comprising:
    a metal support on the support film, the adhesive attaching both the metal support and the first portion of the support film to the main structure, the first portion of the support film being depressed in an area between the metal support and the inner terminal.

4. The interconnecting assembly of claim 1, wherein the inner contact and the inner terminal form an interference fit.

5. The interconnecting assembly of claim 1, further comprising:
    an outer via connecting the conductive lever portion to the outer terminal.

6. The interconnecting assembly of claim 1, further comprising:
    a plurality of inner contacts and outer terminals formed on the opposing sides of the support film, and
    a plurality of lever portions on the support film and connecting a respective one of the inner contacts on a respective one of the outer contacts.

7. The interconnecting assembly of claim 6, further comprising:
    a plurality of inner terminals, wherein each inner contact contacts a respective inner terminal and the first and second portions are moved relatively towards one another so that the second portion of the film is pivoted together with the conductive portions and the outer terminals away from the second portions of the main structure.

8. A method of making an interconnect assembly, comprising:
    positioning an inner contact on an inner terminal;
    moving a first portion of a compliant support film on which the inner contact is formed relatively towards a first portion of a main structure on which the inner terminal is formed so that a second portion of the film pivots together with an outer terminal and a conductive lever portion connecting the outer terminal to the inner contact away from a second portion of the main structure; and
    attaching the first portions to one another.

9. The method of claim 8, wherein the first portions are attached by an adhesive.

10. The method of claim 9, further comprising:
    simultaneously applying heat and pressure to the adhesive to soften the adhesive; and
    allowing the adhesive to cool.

11. The method of claim 10, wherein the pressure is applied with a shaping tool, further comprising:
    securing the shaping tool t the main structure before allowing the adhesive to cool; and
    removing the shaping tool from the main structure after the adhesive is allowed to cool.

* * * * *